(12) United States Patent
Brun et al.

(10) Patent No.: US 8,258,011 B2
(45) Date of Patent: Sep. 4, 2012

(54) METHOD FOR PRODUCING A SET OF CHIPS MECHANICALLY INTERCONNECTED BY MEANS OF A FLEXIBLE CONNECTION

(75) Inventors: Jean Brun, Champagnier (FR); Bruno Mourey, Coublevie (FR); Dominique Vicard, Saint Nazaire les Eymes (FR)

(73) Assignee: Commissariat a l'Energie Atomique, Paris (FR)

( * ) Notice: Subject to any disclaimer, the term of this patent is extended or adjusted under 35 U.S.C. 154(b) by 495 days.

(21) Appl. No.: 12/452,137

(22) PCT Filed: Jun. 20, 2008

(86) PCT No.: PCT/FR2008/000867
§ 371 (c)(1),
(2), (4) Date: Dec. 17, 2009

(87) PCT Pub. No.: WO2009/013409
PCT Pub. Date: Jan. 29, 2009

(65) Prior Publication Data
US 2010/0136746 A1    Jun. 3, 2010

(30) Foreign Application Priority Data
Jun. 21, 2007  (FR) ...................................... 07 04445

(51) Int. Cl.
*H01L 21/44* (2006.01)
(52) U.S. Cl. .......................... 438/113; 438/458; 438/464

(58) Field of Classification Search .................. 438/107, 438/110, 113, 458, 464
See application file for complete search history.

(56) References Cited

U.S. PATENT DOCUMENTS

| | | | |
|---|---|---|---|
| 6,743,982 B2 * | 6/2004 | Biegelsen et al. | 174/69 |
| 6,762,510 B2 * | 7/2004 | Fock et al. | 257/787 |
| 7,372,130 B2 * | 5/2008 | Kikuchi et al. | 257/668 |
| 2002/0094701 A1 | 7/2002 | Biegelsen et al. | |
| 2003/0157783 A1 | 8/2003 | Fonash et al. | |
| 2005/0026328 A1 | 2/2005 | Watanabe | |
| 2009/0283891 A1 * | 11/2009 | Dekker et al. | 257/690 |

FOREIGN PATENT DOCUMENTS

| WO | WO 00/67539 | 11/2000 |
|---|---|---|
| WO | WO 02/084617 A1 | 10/2002 |
| WO | WO 03/021679 A2 | 3/2003 |
| WO | WO 2005/048302 A2 | 5/2005 |
| WO | WO 2006/089439 A1 | 8/2006 |

OTHER PUBLICATIONS

International Search Report issued in International Application No. PCT/FR2008/000867; Mailed on Mar. 19, 2009.

* cited by examiner

*Primary Examiner* — Kevin M Picardat
(74) *Attorney, Agent, or Firm* — Oliff & Berridge, PLC

(57) ABSTRACT

The method relates to production of a set of chips mechanically interconnected by means of a flexible connection. The chips, integrated on a substrate, each comprise a receiving area. The chips of the set are connected in series in the receiving areas by a connecting element. The chips are then released, the connecting element forming a flexible connection.

9 Claims, 3 Drawing Sheets

METHOD FOR PRODUCING A SET OF CHIPS MECHANICALLY INTERCONNECTED BY MEANS OF A FLEXIBLE CONNECTION

BACKGROUND OF THE INVENTION

The invention relates to a method for producing an assembly of chips mechanically interconnected by means of a flexible connection, the method comprising:
  producing chips on a substrate, each chip comprising a receiving area,
  connecting the receiving areas of the chips of the chip set in series by means of a connecting element,
  releasing the chips.

STATE OF THE ART

When a microelectronic chip cannot fulfill a specific function on its own, the latter is in general connected to one or more other chips in order to obtain the required functionality. A large number of techniques exist at the present time for mechanically and electrically connecting microelectronic chips to one another. The conventional technique consists in making a rigid mechanical connection between the chips, once the latter have been formed on a substrate and released by dicing. The chips, then fixed onto a rigid support, are then electrically connected before a protection coating is formed. This first approach consisting in making the connection on a rigid support is conventionally used when there is a great complexity of connection of the chips. However, the main drawback of this approach is that it uses a rigid mechanical support that is particularly unsuitable for integration in flexible structures.

A second approach, described in the document WO-A-02/084617 consists in integrating chips in a set of textile fibers or threads to produce a device. This integration of the chips in the fibers can be achieved by embedding. The different chips can be connected to one another by means of conducting filaments also able to be embedded or encapsulated in the fiber itself. However this document does not indicate how fixing of the conducting material filaments between the different chips and embedding in the fibers is to be performed.

OBJECT OF THE INVENTION

The object of the invention is to provide a method for producing an assembly of chips mechanically connected to one another in flexible manner that is easy to implement.

This object is achieved by the fact that the receiving area being formed by a groove, the connecting element is a thread that is embedded in said groove to achieve said flexible connecting means.

BRIEF DESCRIPTION OF THE DRAWINGS

Other advantages and features will become more clearly apparent from the following description of particular embodiments of the invention given as non-restrictive examples only and represented in the appended drawings, in which.

DESCRIPTION OF PREFERRED EMBODIMENTS OF THE INVENTION

Figure 1:
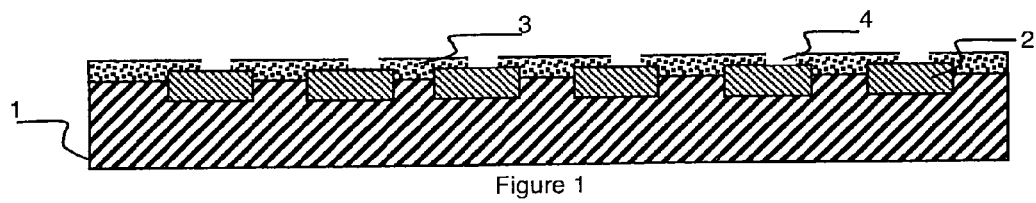
FIGS. 1 to 3 represent schematic cross-sectional views of the successive steps of a first embodiment according to the invention.

As illustrated in FIG. 1, a plurality of microelectronic chips 2 are integrated on a substrate 1 which can be a silicon substrate. Chips 2 can be identical or not. A conventional photolithography step is performed to delineate a receiving area 4 on each microelectronic chip 2 by means of a photoresist resin 3.

Figure 2:
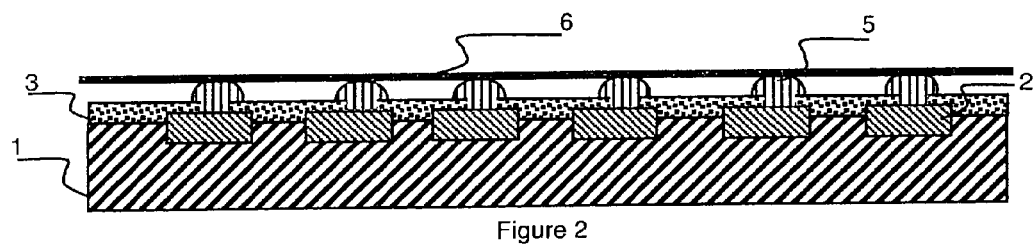

As illustrated in FIG. 2, a fixing agent that can be a glue 5 is deposited on receiving areas 4.

A connecting element 6 is then fixed onto each chip 2 by means of glue 5 to connect the chips to one another. Connecting element 6 is of linear shape. It can have a round or square cross-section and be formed by a thread or a set of threads. Connecting element 6 can be made from an insulating material, for example a natural or synthetic fiber. In the latter case, it can for example be formed by a polymer such as polyester or polyamide. Connecting element 6 is however advantageously made from conducting material, for example metallic, to achieve an electrical connection between chips 2. In this case, glue 5 is advantageously conducting and receiving area 4 can contain a contact area which makes the electrical connection with the components of chip 2. The length of connecting element 6 connecting two receiving areas 4, and therefore two chips 2, depends on their future use. Thus for example, the length of connecting element 6 between two receiving areas can be greater than the distance initially separating the two receiving areas 4 (see FIG. 6). For example, greater lengths of connecting element 6 are recommended to enable subsequent storage of chips 2, for example in the form of a coil or a ring, or if chips 2 use the connecting element as antenna. In this case, connecting element 6 can form a loop between two receiving areas 4.

Figure 3:
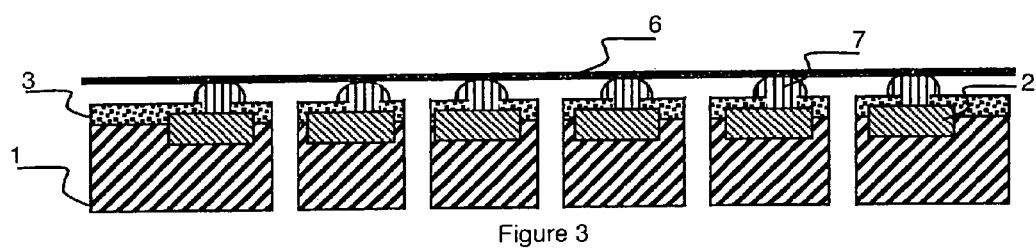

As illustrated in FIG. 3, substrate 1 is then patterned so as to release chips 2 and the corresponding part of substrate 1 from one another. Chips 2 are then only connected in series by a flexible mechanical connection by means of connecting element 6. Release of chips 2 is performed in the case of a bulk substrate 1 in conventional manner, for example by dicing, taking care not to cut connecting element 6.

Fixing between connecting element 6 and chip 2 is greatly facilitated as all the chips are initially secured to the same rigid support formed by substrate 1. This operation then resembles the techniques conventionally used in the microelectronics industry.

In an alternative embodiment wherein the connection between chips 2 is not only mechanical but also electrical, chips 2 presenting different functionalities can be connected to one another. These chips 2 can then be integrated on one and the same substrate 1 or on different substrates and then connected by means of a single connecting element 6.

Figure 4:
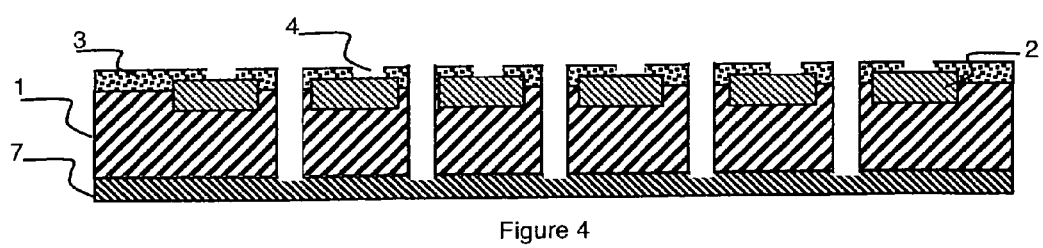
FIGS. 4 and 5 represent schematic cross-sectional views of the successive steps of a second embodiment according to the invention.
Figure 5:
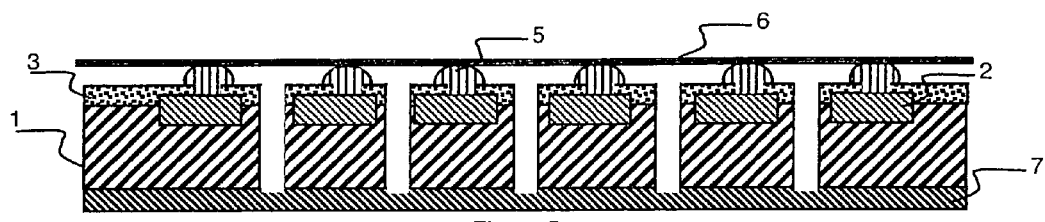

In an alternative embodiment illustrated in FIGS. 4 and 5, a provisional support 7 constituting a securing film is initially deposited on the surface of substrate 1 opposite the surface comprising chips 2. As illustrated in FIG. 4, chips 2 are released from one another at the level of substrate 1 after receiving areas 4 have been formed in the photoresist. They do however remain mechanically secured to one another by means of provisional support 7. This partial releasing of chips 2 is achieved by any suitable method, for example by dicing or by plasma etching.

As illustrated in FIG. 5, connecting element 6 is then fixed to each of chips 2 on receiving area 4 as previously. Provisional support 7 is then removed and chips 2 are then only secured to one another by means of the flexible mechanical connection formed by connecting element 6, as in FIG. 3.

Figure 6:
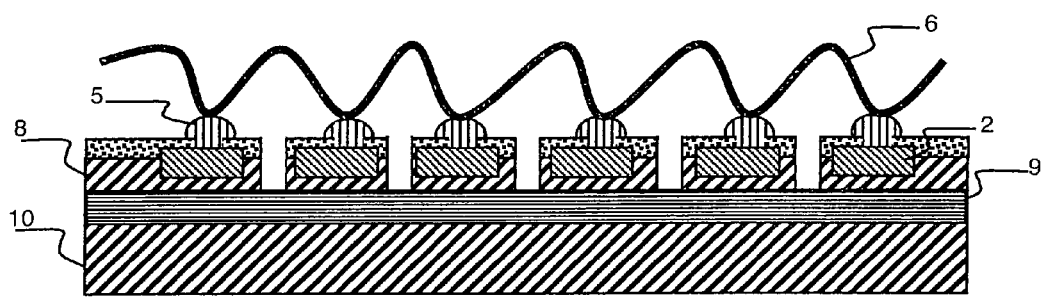
FIG. 6 represents a schematic cross-sectional view of a third embodiment according to the invention.

In another alternative embodiment illustrated in FIG. 6, chips 2 are integrated on a substrate on insulator (SOI). The latter conventionally comprises an active substrate 8 arranged on a buried insulator 9 formed on a support substrate 10. Active substrate 8 can be assimilated to substrate 1 whereas buried insulator 9 and support substrate 10 constitute a provisional support. In a similar manner to FIG. 5, in FIG. 6 chips 2 have already been partially released at the level of active substrate 8 and of connecting element 6 fixed to each of chips 2. The chips can then be released from the provisional support formed by buried insulator 9 and support substrate 10, for example by wet etching of buried insulator 9, in particular by means of hydrofluoric acid. It is also possible to release the provisional support by splitting, the latter then being secured to the chip but no longer providing any mechanical function. As in the foregoing, chips 2 only remain connected to one another by connecting element 6.

Figure 7:
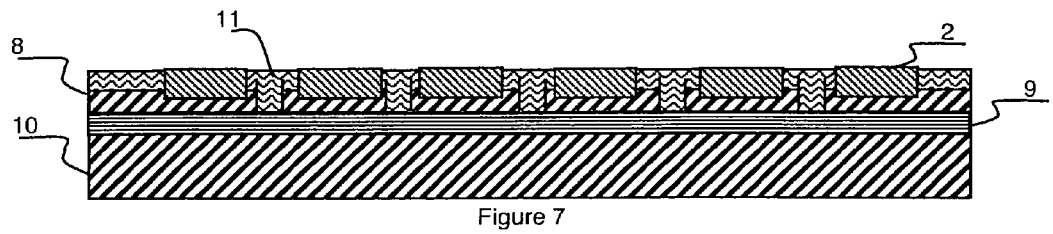
FIGS. 7 and 8 represent schematic cross-sectional views of the successive steps of a fourth embodiment according to the invention.
Figure 9:
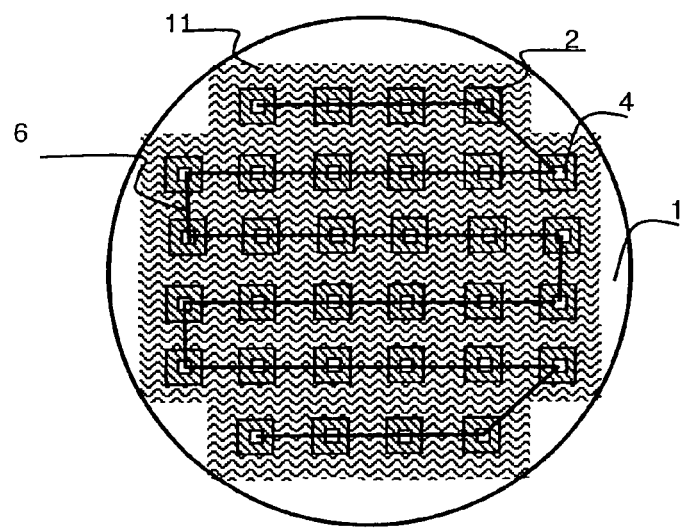
FIG. 9 represents a schematic top view of FIG. 8 after photo-lithography.
Figure 10:
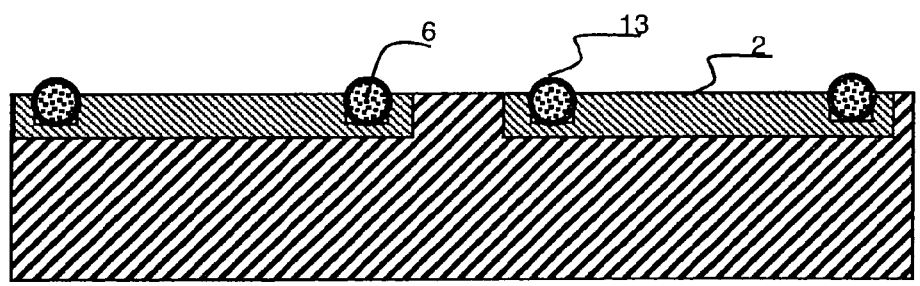
FIGS. 10 and 11 represent schematic cross-sectional views of the successive steps of a fifth embodiment according to the invention.

In an alternative embodiment (not represented), connecting element 6 is fixed to each chip 2 by welding and not by bonding, at the level of a contact area of the chip for example in the form of a pad. In this case, the contact area constitutes receiving area 4 and the steps of deposition of photoresist 3 and of formation of receiving areas by photolithography are eliminated. Connecting element 6 is preferably secured on the contact area and ultrasonic vibration is implemented to perform welding. The operation is then repeated on each contact area to make the different welds. If connecting element 6 is to act as electrical connection between chips 2, the former is made from conducting material, which is preferably metallic, and the contact area of the chip is also made from conducting material which is also preferably metallic. Welding can be performed before the chips are diced, as in FIG. 2, or after the chips have been partially diced, as in FIGS. 4 and 6, before removal of the provisional substrate is performed (FIGS. 7 or 9 and 10). This welding can also be achieved for example by filler material, plasma, electrolysis, cathode sputtering and so on.

Figure 8:
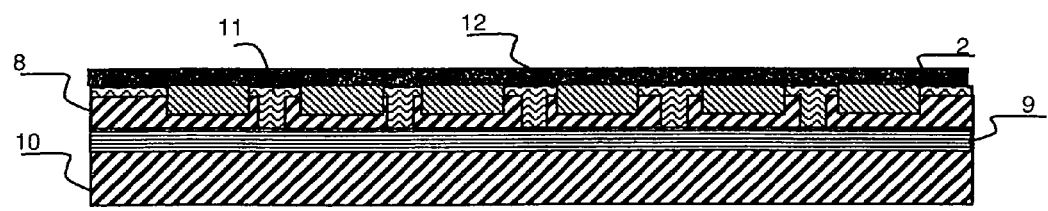

In another alternative embodiment illustrated in FIGS. 7 to 9, chips 2 are integrated on a substrate on insulator. Fixing of connecting element 6 is performed neither by welding nor by bonding. Chips 2 are released from one another at the level of the layer of active substrate 8 by standard dicing or by dry etching up to buried insulator 9. Then a filler material 11, for example a resin, fills the dicing lines thus formed in layer 8. In the example represented in FIGS. 7 to 8, filler material 11 fills the whole space situated between the two chips 2. A layer 12 formed by the connecting material designed to constitute the connecting elements is then deposited on the assembly of chips thus obtained (FIG. 8). Connecting material 12 can be conducting or insulating, for example of mineral type, for example made from silicon nitride or oxide, or of organic type, for example made from parylene®. This deposition is patterned in conventional manner, for example by photolithography and plasma etching to form a conducting or insulating track constituting connecting element 6 connecting chips to one another at the level of receiving areas 4 formed by the contact pads, as illustrated in top view in FIG. 9. Filler material 11 is then removed by any suitable method and chips 2 are released from their support, for example by removing buried insulator 9.

Figure 11:
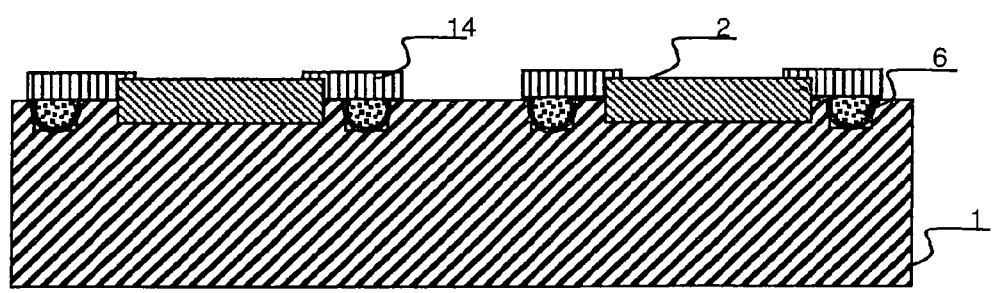

In another embodiment illustrated in FIGS. 10 and 11, a receiving area 4 is formed by at least one recess made in chip 2, preferably adjacent to the microelectronic components. The recess can for example be formed by a groove or a hole. A large number of shapes of grooves or holes are possible, in particular with a square base, V-shaped, truncated V-shaped or in the shape of an arc of a circle. The dimensions and shape of the recess will preferably be chosen according to the characteristics of connecting element 6. For example, the depth and width of a groove can vary in a range from 20 to 100 µm for a connecting element 6 with a diameter of 20 to 100 µm. The recesses can be made by means of any suitable technique, for example by dry etching, dicing, or by means of wet etching for example with a KOH solution.

As illustrated in FIG. 10, a flexible connecting element 6 in thread form is then embedded in each of the grooves, which are of square cross-section in FIG. 10. If connecting element 6 is electrically conducting, the latter is advantageously coated with a layer of insulating material 13 to prevent any short-circuiting with substrate 1. In the opposite case, electrical insulation of the groove can be performed by any known method. If insulating material 13 is a thermosetting polymer, hot insertion is preferably used to facilitate embedding and to bond connecting element 6 inside the groove.

Chips 2 are then conventionally released from the support layer and are then only connected to one another by a flexible connection by means of connecting element 6.

As illustrated in FIG. 11, an additional step of electrical connection between connecting element 6 and chip 2 is performed in the case where electrical connection of chip 2 with the outside has to be performed by means of connecting element 6. Electrical connection between element 6 and a contact pad of chip 2 can be made in the form of a conducting track 14 by any known means, for example by inkjet, screen printing, or use of a conducting glue.

In an alternative embodiment, not represented, the electrical connection can also be made for example by means of a conducting layer deposited on an inner portion of the groove. The electrical connection can also be made by means of a conducting layer that acts as stop layer when the groove for embedding the thread is formed (electrical connection via the bottom of the groove) or is etched when the groove is formed (electrical connection via the edge of the groove). All these embodiments have the object of transmitting a current between the thread that is conducting and the chip.

In FIGS. 10 and 11, two recesses associated with each chip and two connecting elements 6 can connect a chip to two different chips. It is also possible for each chip to comprise two grooves and for two connecting elements to then connect each chip. The chip then comprises an additional groove.

This embodiment can advantageously be used with a substrate comprising a provisional film, for example a SOI substrate, in similar manner to that described in the foregoing embodiments. Release of the SOI substrate can then be achieved as before by etching a buried dielectric or by splitting the substrate.

In a general manner, a large number of chips 2 formed on one and the same wafer can be connected in series with one another by at least one flexible connecting element and released from one another. An assembly of chips is thereby obtained in the form of a flexible string able to be stored in the form of a coil or a roll and diced as required. The assembly of chips is advantageously coated with a polymer or any other material providing protection against aggressions from the outside environment.

This type of assembly of chips can for example be advantageously used for equipping antennas with RFID chips. A plurality of RFID chips 2 are thus formed and connected by a flexible conducting connecting element 6. The length of connecting element 6 separating two chips 2 advantageously corresponds to the useful length of the antenna. Sectioning of the connecting element 6 is then performed between two chips 2 and enables RFID chips equipped with their antennas to be obtained.

The invention is not limited to the embodiments described above. In particular, different types of chips coming from different substrates can be connected by a single connecting element 6 thereby enabling complex functionalities to be obtained. Furthermore, production of an assembly of chips can use a combination of the features described above in relation with the different embodiments.

The invention is not limited to the embodiments described above and encompasses an alternative embodiment (not represented) wherein the assembly of chips is not produced by means of a single thread that is connected to the assembly of chips or to a large number of chips. In this embodiment, two consecutive chips are connected to one another by means of at least one individual thread. An individual thread is thus connected to two chips and each individual thread of the assembly of chips performs flexible connection of the assembly. In this way, the chips being connected two by two by an individual thread, it is easier to perform functionalization of the assembly of chips, i.e. associating the chips in a desired order to enable the required technological functions to be obtained. It is then possible for a single groove to accommodate two different individual threads at each of its ends and for these threads to each be connected to a different conducting area.

In a general manner, from a substrate, a single set grouping all the chips or several sets advantageously formed by a precise organization of different chips of the substrate can be formed.

The invention claimed is:

1. A method for producing an assembly of chips comprising:
   producing chips on a substrate, each chip comprising a groove,
   connecting the chips by embedding a flexible thread in the groove thereby forming the assembly of chips,
   releasing the chips, while maintaining the thread interconnected to the chips.

2. The method according to claim 1, wherein the thread is electrically conducting.

3. The method according to claim 1, wherein the substrate being initially secured to a provisional support, the method comprises a step of partial dicing of the chips, at the level of the substrate, before connecting the chips, the provisional support is eliminated when the chips are released.

4. The method according to claim 3, wherein the provisional support is a securing film formed on a surface of the substrate opposite to the chips.

5. The method according to claim 3, wherein the provisional support is a SOI substrate, releasing is performed by elimination of a buried insulator.

6. The method according to claim 1, wherein the grooves comprise a concave, square or circular cross-section.

7. The method according to claim 1, wherein an additional groove being formed on the chips, an additional thread connects each chip.

8. The method according to claim 1, wherein the set of chips forms a coil.

9. The method according to claim 1, wherein two consecutive chips are connected by an individual thread.

\* \* \* \* \*